(12) United States Patent
Camarota

(10) Patent No.: US 8,913,455 B1
(45) Date of Patent: Dec. 16, 2014

(54) DUAL PORT MEMORY CELL

(71) Applicant: Xilinx, Inc., San Jose, CA (US)

(72) Inventor: Rafael C. Camarota, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 13/953,390

(22) Filed: Jul. 29, 2013

(51) Int. Cl.
*G11C 8/00* (2006.01)
*G11C 7/10* (2006.01)
*G11C 11/00* (2006.01)
*H01L 21/8238* (2006.01)
*G11C 11/412* (2006.01)

(52) U.S. Cl.
CPC .......... *G11C 11/412* (2013.01); *H01L 21/8238* (2013.01)
USPC ................. 365/230.05; 365/189.04; 365/154; 365/156

(58) Field of Classification Search
USPC .................................................. 365/230.05
See application file for complete search history.

(56) References Cited

U.S. PATENT DOCUMENTS

| | | | | | |
|---|---|---|---|---|---|
| 5,282,174 | A | * | 1/1994 | Little | 365/230.05 |
| 5,566,123 | A | | 10/1996 | Freidin et al. | |
| 5,631,577 | A | | 5/1997 | Freidin et al. | |
| 5,956,748 | A | | 9/1999 | New | |
| 6,288,969 | B1 | * | 9/2001 | Gibbins et al. | 365/230.05 |
| 6,297,665 | B1 | | 10/2001 | Bauer et al. | |
| 6,341,083 | B1 | | 1/2002 | Wong | |
| 6,353,332 | B1 | | 3/2002 | Brelet | |
| 6,738,306 | B2 | * | 5/2004 | McLaury | 365/230.05 |
| 6,970,373 | B2 | * | 11/2005 | Datta et al. | 365/154 |
| 7,295,459 | B2 | * | 11/2007 | Islam | 365/156 |
| 7,606,062 | B2 | * | 10/2009 | Hsu et al. | 365/154 |
| 7,915,691 | B2 | * | 3/2011 | Wong et al. | 257/392 |
| 8,295,099 | B1 | | 10/2012 | Yachareni et al. | |
| 8,582,352 | B2 | * | 11/2013 | Liaw | 365/154 |
| 8,625,334 | B2 | * | 1/2014 | Liaw | 365/154 |
| 8,675,397 | B2 | * | 3/2014 | Liaw | 365/154 |
| 2008/0212392 | A1 | * | 9/2008 | Bauer | 365/230.05 |
| 2010/0237419 | A1 | | 9/2010 | Yang et al. | |
| 2011/0026289 | A1 | | 2/2011 | Liaw | |
| 2011/0026308 | A1 | * | 2/2011 | Liaw | 365/154 |
| 2011/0068400 | A1 | * | 3/2011 | Wang et al. | 257/347 |
| 2012/0228714 | A1 | | 9/2012 | Lim et al. | |
| 2013/0181297 | A1 | | 7/2013 | Liaw | |

OTHER PUBLICATIONS

Specification and drawings for U.S. Appl. No. 14/020,264, filed Sep. 6, 2013, Camarota.
Brennan, Cheryl, *Introduction to Multi-Port Memories*, Application Note AN-253, Mar. 2000, pp. 1-2, Integrated Device Technology, Inc., Santa Clara, California, USA.
Silburt, Allan L. et al., "A 180-MHz 0.8 μm BiCMOS Modular Memory Family of DRAM and Multiport SRAM," *IEEE Journal of Solid-State Circuits*, Mar. 1993, pp. 222-232, vol. 28, No. 3, IEEE, Piscataway, New Jersey, USA.

* cited by examiner

*Primary Examiner* — Son Mai
(74) *Attorney, Agent, or Firm* — LeRoy D. Maunu

(57) ABSTRACT

A multi-port memory cell is disclosed that includes first and second cross-coupled inverter circuits. The input node of each inverter circuit is coupled to the output node of the other inverter circuit to receive the inverted output of the other inverter circuit. The multi-port memory cell includes a first pair of access transistors of a first type, each coupled to the input node of a respective one of the first and second inverter circuits. The multi-port memory cell also includes a second pair of access transistors of the second type, each coupled to the input of a respective one of the first and second inverter circuits. The multi-port cell exhibits advantages in layout compactness and SEU tolerance.

20 Claims, 5 Drawing Sheets

DUAL PORT MEMORY CELL

TECHNICAL FIELD

The disclosure generally relates to memory cells in integrated circuits (ICs).

BACKGROUND

Static Random Access Memory (SRAM) is a type of semiconductor memory that uses bi-stable latching circuitry to store each bit. SRAM is used as data storage in many electronic devices and is often used to implement programmable logic integrated circuits (ICs).

An SRAM cell can be written to or read from. Generally, an SRAM cell provides a voltage at an output port and a sense amplifier senses whether the voltage held in the SRAM represents a digital value of 1 or a digital value of 0. Some SRAM cells have a single port used to both write data in and read data out. Other SRAM cells have multiple ports which can be used in a variety of ways and for various purposes. In some ICs, multi-port SRAM cells may be operated in single-port or multi-port mode.

ICs that have SRAM arrays are being implemented with increasingly denser and denser process technologies. The result is higher and higher bit density per IC. Any memory system is susceptible to random up-sets which result in the flipping of bits and faulty operation. The Failure in Time (FIT) rate of memories is measured in failures per megabits per 10^12 seconds. The Mean Time to Failure (MTBF) is inversely proportional to the product of memory density, ICs per system, and FIT. If the memory density of ICs are increases but FIT and ICs per system stay constant the MTBF of systems using the ICs will drop to unacceptable levels. In designing ICs with increasingly higher bit counts it becomes necessary to find ways to reduce the cell FIT proportional to the density increase. Many design decisions will be driven by improving memory density and some will be driven by the need to improve FIT.

SUMMARY

A multi-port memory cell includes first and second inverter circuits. Each inverter circuit includes a pull-up transistor of a first type and a pull-down transistor of a second type. In each inverter circuit, a gate of the pull-up transistor and a gate of the pull-down transistor are each coupled to a first node and receive the same voltage potential. A source of the pull-up transistor and a drain of the pull-down transistor are coupled in series and provide an inverted output at a second node between the pull-up and pull-down transistors. The first node of each inverter circuit is coupled to the second node of the other inverter circuit to receive the inverted output of the other inverter circuit. The multi-port memory cell includes a first pair of access transistors of the first type, each coupled to the first node of a respective one of the first and second inverter circuits. The multi-port memory cell also includes a second pair of access transistors of the second type, each coupled to the first node of a respective one of the first and second inverter circuits.

A method is also provided for constructing a dual-port memory cell. A plurality of well regions are formed in a substrate and extend in parallel in a first direction (y). On each of the plurality of well regions, a respective set of one or more fin structures are formed. Each fin structure extends in the first direction (y). A plurality of gate structures are formed with each gate structure disposed over one or more of the sets of fin structures. The plurality of gate structures extend in a second direction (x) that is perpendicular to the first direction (y). The sets of fin structures and gate structures are configured and arranged to form fin field effect transistors (FinFETs). Electrically conductive lines are placed to couple the FinFETs to form a memory cell. The memory cell has first and second inverter circuits. Each inverter circuit includes a pull-up transistor of a first type and a pull-down transistor of a second type. In each inverter circuit, a gate of the pull-up transistor and a gate of the pull-down transistor are each coupled to a first node and receive the same voltage potential. A source of pull-up transistor and a drain of the pull-down transistor are coupled in series and provide an inverted output at a second node between the pull-up and pull-down transistors. The first node of each inverter circuit is coupled to the second node of the other inverter circuit to receive the inverted output of the other inverter circuit. The memory cell further includes a first pair of access transistors of the first type, each coupled to the first node of a respective one of the first and second inverter circuits. The memory cell further includes a second pair of access transistors of the second type, each coupled to the first node of a respective one of the first and second inverter circuits.

It will be appreciated that various other exemplary structures and methods are set forth in the Detailed Description and Claims, which follow.

BRIEF DESCRIPTION OF THE DRAWINGS

Various aspects and advantages of the invention will become apparent upon review of the following detailed description and upon reference to the drawings, in which:

FIGS. 2-1 through 2-3 show a first semiconductor layout of a dual port memory cell;

FIGS. 3-1 and 3-2 show a second semiconductor layout of a dual port memory cell;

DETAILED DESCRIPTION

Figure 1:
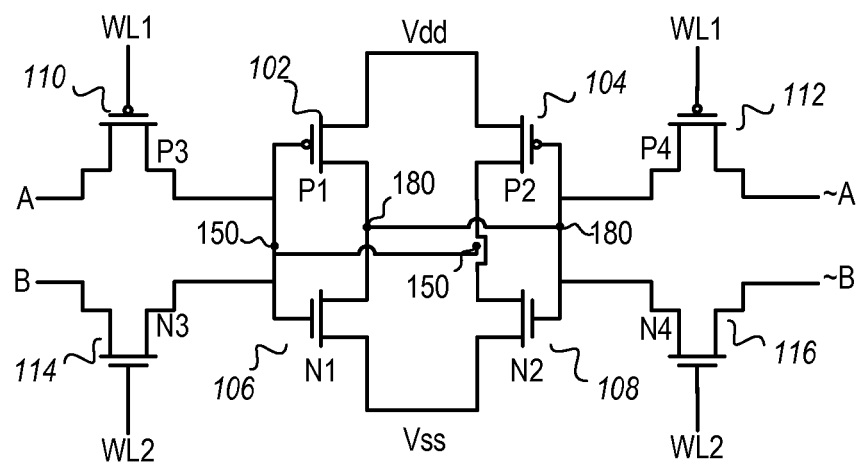
FIG. 1 shows a circuit diagram of a dual port memory cell.

Static Random Access Memory (SRAM) is a type of semiconductor memory that uses bi-stable latching circuitry to store each bit. A typical SRAM cell includes two inverter circuits in a cross-coupled arrangement, where the input of each inverter is coupled to the output of the other inverter. In this cross-coupled arrangement the inverters maintain two stable states (e.g., logical 0 and logical 1). More specifically, the inverted output of a first inverter is used as input to a second inverter. The second inverter reverts the inverted output of the first inverter to the original value and is used to maintain the inverters in a constant state once inputs are removed. In a typical SRAM cell, four transistors are used to implement the cross-coupled inverter arrangement, with each inverter implemented using two complementary transistors, e.g., p-type and n-type metal-oxide-semiconductor FETs (MOSFETS). In addition to the cross-coupled inverter arrangement, access transistors serve to control the access during read and write operations.

Transistors in an SRAM cell are sized and bit line voltages are set so that the stored data value is not changed during read operations. Similarly, transistors and bit line levels must be sized so bit-line voltages can change the stored data value during write operations. These requirements place close noise margins on the bit-line voltages to ensure correct operation. Noise margins are further reduced by any performance mismatch exhibited by the access transistors. Bit-lines may also be referred to as signal lines and such terms are used interchangeably herein. Generally, performance exhibited by transistors of different doping types, such as n-type MOSFETs NMOS and p-type MOSFETs (PMOS), is not sufficiently matched for use as access transistors in an SRAM cell. For instance, due to the body bias effect on the threshold voltages of MOSFETS, PMOS transistors pass strong high bit values (e.g., logical 1) and weak low bit values (e.g., logical 0). In contrast, NMOS transistors pass weak high bit values and strong low bit values. Due to the performance mismatch of NMOS and PMOS transistors, SRAM cells typically use the strongest type as access transistors (e.g., NMOS or PMOS) and may include additional circuitry to maintain read and write noise margins such as bitline and wordline voltage modulation. Matched transistors exhibit similar performance characteristics. Transistors of different types can be somewhat matched by using different gate dimensions for each type of transistor. However, due to the body bias effect, it has been traditionally been very difficult (if not impossible) to sufficiently match transistors of different types as required for a particular application. For this reason, SRAM cells are typically implemented with access transistors that are all one type.

However, using access transistors of the same type results in a larger layout for complementary MOSFET (CMOS) manufacturing processes. Some aspects of the present disclosure are directed toward a multi-port SRAM cell having both PMOS and NMOS access transistors. As discussed in more detail below, it has been surprisingly discovered that performance exhibited by PMOS (p-type MOSFET) and NMOS (n-type MOSFET) FinFETs are more closely matched than planar PMOS and NMOS FETs. One or more examples described herein implement a dual-port SRAM cell having both p-type and n-type access transistors using FinFETs. Some other aspects of the present disclosure are directed toward a compact layout of a multi-port SRAM cell for FinFET manufacturing processes.

One fundamental challenge to efficient layout is a balance of resources in the two respective well types (P and N). A balance to the well types requires a balanced amount of area required by the respective P and N type transistors that use the well types. For instance, a typical single port cell will have 4 NMOS transistors and 2 PMOS transistors. This imbalance is a challenge to efficient layout. A typical dual-port SRAM cell has even greater imbalance (with 6 NMOS transistors and 2 PMOS transistors), which makes efficient design even harder for dual-port SRAM cells. One or more examples described herein provide a balanced dual-port cell (having 4 NMOS transistors and 4 PMOS transistors). This balance of resources in the respective P and N well types would allow one skilled in the art of layout the maximum opportunity to achieve an efficient layout.

Another aspect of modern deep-sub micron memory cell design is the sensitivity to upset caused by sub-atomic particles passing through the source-drain to well junction. Neutron and Alpha particles are of particular concern due to their ability to inject charge into the junction. The charge can upset the static state of the memory cell. This memory cell upset mechanism is commonly referred to as Single-Event-Upset or SEU. The primary source of Neutrons is solar radiation, while alpha particles come from radioactive decay of packaging materials. The NMOS transistor source-drain to well junction is more sensitive to SEU. The typical single port cell has more NMOS junction area than PMOS. The addition of each NMOS port further increases the SEU sensitivity of the memory cell. Some embodiments of the present disclosure add additional ports to the single port SRAM cell using PMOS access transistors. This allows the number of ports in the SRAM memory cell to be increased without the typical increase in SEU sensitivity.

The disclosed examples are applicable to multi-port memory cells having any number of a plurality of cells. However, for ease of explanation and illustration, the examples herein are primarily described with reference to a dual-port memory SRAM cell.

Turning to the figures, FIG. 1 shows a circuit diagram of a dual-port SRAM cell. The SRAM cell in this example is an eight transistor (8T) SRAM cell. The SRAM cell includes a first inverter (transistors 102 and 106), cross-coupled with a second inverter (transistors 104 and 108).

The first and second inverters each include a respective pull-up transistor 102/104 and a respective pull down transistor 106/108 coupled in series to provide an inverted output at an output node (Out1/Out2) between the pull-up and pull-down transistors. An input node (150/180 of each inverter (coupled to the gates of the pull-up and pull-down transistors) is connected to the output node (180/150) of the other inverter to receive the inverted output of the other inverter.

As described above, the inverted output (made of 102 and 106) is connected to a gate input of the second inverter (made of 104 and 108). The second inverter reverts the inverted output of the first inverter to the original value and is used to maintain the inverters in a constant state once an input voltage is removed. In this manner, a bit can be stored in the SRAM cell.

In this 8T example, PMOS transistors 110 and 112 are respectively coupled to complementary signal lines A and ~A to provide a first read/write access port for the SRAM cell. Transistors 110 and 112 are enabled by a first write line (WL1). NMOS transistors 114 and 116 are respectively coupled to complementary signal lines B and B to provide a second read/write access port for the SRAM cell. Transistors 114 and 116 are enabled by a second write line (WL2). Although it is not strictly necessary to have two signal lines (e.g., A and ~A) for each port, use of complementary signal lines may improve noise margins of the SRAM cell.

For ease of explanation, various examples are described in the context of an 8T SRAM cell. However, the various examples are understood to be applicable to other multi-port SRAM configurations as well.

Figures 1, 2:
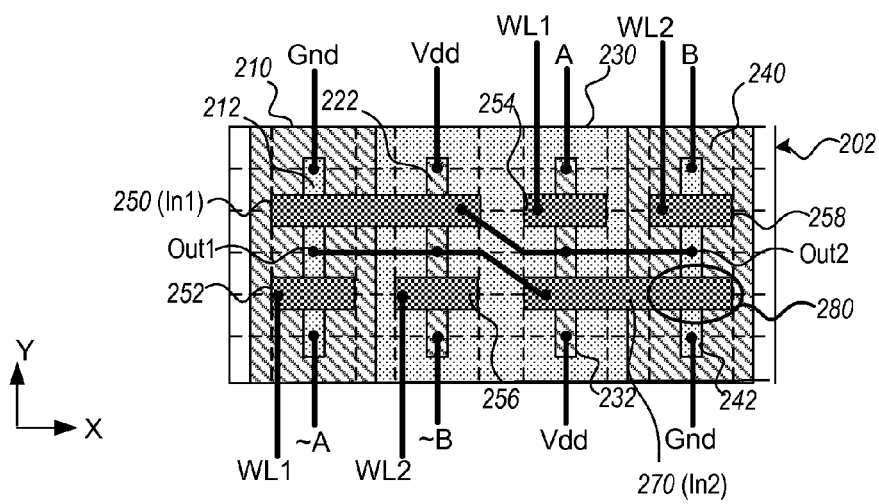
Figures 2, 3:
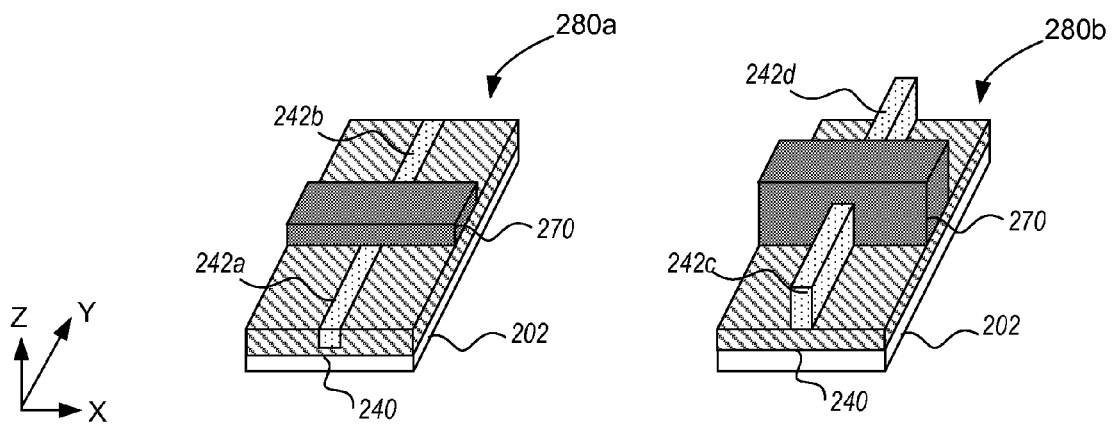
Figures 1, 3:
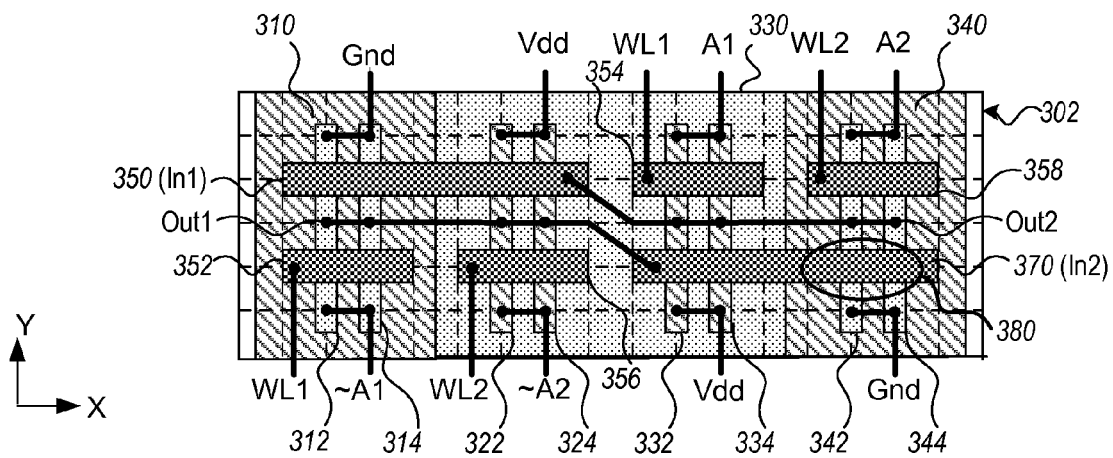
Figures 2, 3:
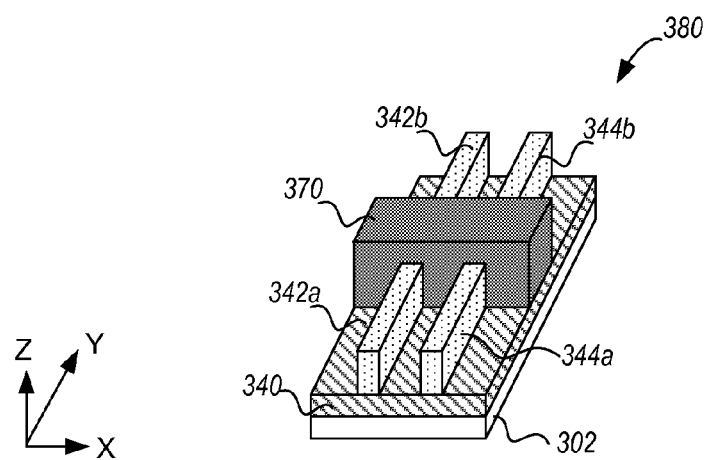

FIGS. 2-1 through 2-3 show a first semiconductor layout of a dual port memory cell. FIG. 2-1 shows a plan view of a first compact semiconductor layout for the 8T SRAM cell shown in FIG. 1. The layout in FIG. 2-1 shows a substrate 202 segmented by evenly spaced dashed grid lines. A plurality of well regions (210, 230, and 240) are formed in/on the substrate, and the well regions extend in parallel along grid lines in a first direction (y). Wells 210 and 240 have a p-type semiconductor doping (indicated as diagonal hashing). Well 230 has an n-type semiconductor doping (indicated as dotted pattern). Source/drain structures 212, 222, 232, and 242 are formed on or in respective wells 210, 230, 230, and 240. The source/drain structures each have a semiconductor doping that is opposite of the type of semiconductor doping of the corresponding well. Transistor gate structures 250, 252, 254, 256, 258, and 270 are formed along grid lines in the x-direction. The wells, source/drain structures, and gate structures form a plurality of transistors at points wherein the gate structures are formed over the wells and source/drain structures. For instance, one transistor is formed at 280 with a gate terminal 270 and source/drain terminals 242 on either side of the gate terminal 270. Metal or poly-silicon conductive lines (shown as thick dark lines) connect nodes of the transistors to form first and second inverters having nodes 250 and 270. Nodes 250 and 270 connected to respective input gates (In1/In2) and to respective output diffusions (Out2/Out1). The inverters are cross coupled by the conductive lines to form the 8T SRAM cell in FIG. 1.

The layout shown in FIG. 2-1 may be used for either planar or FinFET manufacturing processes. FIG. 2-2 shows a perspective view of an example transistor 280a corresponding to 280 in the layout of FIG. 2-1 when implemented using a planar FET manufacturing process. As shown in FIG. 2-2, well 240 is formed in substrate 202 and source/drain structures are formed in the well 240. Gate structure 270 is formed over a channel region between first and second portions (242a and 242b) of the source/drain structure. When planar transistors are used to implement the memory cell shown in FIG. 2-1, PMOS and NMOS access transistors should be implemented with different gate dimensions to mitigate differences in performance of the PMOS and NMOS access transistors causes by the body bias effect.

FIG. 2-3 shows a perspective view of an example transistor 280b, corresponding to 280 in the layout of FIG. 2-1 when implemented using a FinFET manufacturing process. As shown in FIG. 2-3, well 240 is formed in substrate 202. Fin structures 242c and 242d are formed on top of well 240 and substrate 202. The fin structures form the source/drain structures shown in FIG. 2-1. Gate structure 270 is formed over a channel region between the fin structures 242c and 242d (under the gate structure 270). In the resulting FinFET, this channel region is located at a vertical distance that is further from the substrate in comparison to the channel region in a planar transistor. Due to the increased distance of the channel region from the substrate, the FinFET exhibits less body effect. As a result, performance of p-type and n-type FinFETs are more closely matched in the 8T cell manufactured using FinFET processes. Due to the close matching of performance in p-type and n-type FinFETs, p-type and n-type access transistors may be implemented with the same gate dimensions and same number of fins, thereby simplifying the manufacturing process while achieving matched performance of the access transistors. For instance, source/drain structures may have the same width in the x direction and the same height in a vertical direction (z). It is recognized that in some implementations, different gate dimensions or number of fins may be used for p-type and n-type FinFETs to adjust read/write margins as required for a particular application.

The semiconductor layout shown in FIG. 2-1 provides a compact implementation of the 8T memory cell shown in FIG. 1. In this example, the 8T SRAM cell can be implemented using only three wells and source/drain structures formed along grid lines in the y-direction and only two gate structures formed along grid lines in the x-direction. In a large array of cells the 210 and 240 wells would join with neighboring wells to form well regions of equal size. This is the most compact layout of a single SRAM cell. However, the 8T SRAM cell may be implemented using more wells, gate structures, and gate structures in a layout that is more spread out.

The space required for the semiconductor layout shown in FIG. 2-1 is particularly compact because space needed for isolation between several transistors can be omitted. Generally, design rules require that wells and source/drain regions be separated by a minimum isolation region. This isolation is not needed between several of the transistors of the circuit shown in FIG. 1 where source/drain regions of two transistors are connected. For instance, access transistor 112 and pull down transistor 114 in FIG. 1 may both be implemented using well 210, source/drain structure 212, and gate structures 250 and 252 in FIG. 2-1. As shown in FIG. 2-1, not only can isolation between these two transistors be omitted, the two transistors may be implemented with a shared source/drain region (e.g., between 250 and 252). Due to the elimination of some of the isolation regions and reused of source/drain regions, space required by the layout is significantly reduced. In some implementations, each transistor of the SRAM cell shares a source/drain region with at least one other transistor of the neighbor SRAM cell.

In the layout shown in FIGS. 2-1 and 2-3, the 8T SRAM cell is implemented using single-fin FinFETs. In some embodiments, the 8T SRAM may be implemented using FinFETs having two or more fin in each FinFET. For example, FIGS. 3-1 and 3-2 show a second semiconductor layout for a dual port memory cell implemented using two-fin FinFETs.

FIG. 3-1 shows a top view of a second compact semiconductor layout for the 8T SRAM cell shown in FIG. 1. The layout in FIG. 3-1 is similar to that shown in FIG. 2-1 but with a second fin included in each FinFET. FIG. 3-1 shows a substrate 302 segmented by dashed grid lines. A plurality of well regions (310, 330, and 340) is formed in the substrate 302. The well regions extend in parallel along grid lines in direction y. Wells 310 and 340 have a p-type semiconductor doping (indicated as diagonal hashing). Well 330 has an n-type semiconductor doping (indicated as a dotted pattern). The wells in FIG. 3-1 may be twice as wide as the wells of FIG. 2-1 (in direction x) to accommodate multiple fins.

Pairs of fin structures 312-314, 322-324/332-334, and 342-344 are formed on/in respective wells 310, 330, and 340. The source/drain structures each have a semiconductor doping that is opposite of the type of semiconductor doping of the corresponding well. Transistor gate structures 350, 352, 354, 356, 358, and 370 are formed along grid lines in the x-direction. The wells, source/drain structures, and gate structures form a plurality of transistors at points wherein the gate structures are formed over the wells and source/drain structures as described with reference to FIG. 2-1. Metal or poly-silicon conductive lines (shown as thick dark lines) connect nodes 350/370 of the transistors. Nodes 350 and 370 connected to respective input gates (In1/In2) and to respective output diffusions (Out2/Out1). The inverters are cross coupled by the conductive lines to form the 8T SRAM cell in FIG. 1.

The semiconductor layout shown in FIG. 3-1 is very compact because space needed for isolation between several transistors can be omitted. As discussed with reference to FIG. 2-1, contrary to typical design rules, several isolation regions are omitted in the layout shown in FIG. 3-1. These isolation regions are not needed between several of the transistors of the circuit shown in FIG. 1 where source/drain regions of two transistors are connected. For instance, access transistor 112 and pull down transistor 114 in FIG. 1 may both be implemented using well 310, source/drain structure 312, and gate structures 350 and 352 in FIG. 2-1. As shown in FIG. 3-1, not only can isolation between these two transistors be omitted, the two transistors may be implemented with a shared source/drain region (e.g., between 350 and 352). Due to the elimination of some of the isolation regions and reused of source/drain regions, space required by the layout is significantly reduced. In some implementations, each transistor of the SRAM cell shares a source/drain region with at least one other transistor of the SRAM cell.

For discussion purposes, construction of the plurality of transistors in FIG. 3-1 is described with reference to one transistor 380 of the plurality of transistors formed by the wells, source/drain structures, and gate structures. FIG. 3-2 shows a perspective view of an example transistor 380 in the layout of FIG. 3-1. As shown in FIG. 3-2, well 340 is formed in substrate 302. Fin portions 342a, 342b, 344a, and 344b are formed on top of well 340 and substrate 302. Gate structure 370 is formed over a channel region between the fin portions 342a and 342b and between 344a and 344b. The two fins in each FinFET for respective transistors have a common gate. As shown in FIG. 3-1, conductive signal lines couple the two transistors of each FinFET in parallel. In some implementations, each FinFET may include more than two fins.

As discussed with reference to FIG. 2-3, due to the close matching of performance in p-type and n-type FinFETs, the p-type and n-type access transistors may be implemented with the same gate dimensions and number of fins—thereby simplifying the manufacturing process while achieving matched performance of the access transistors. For instance, source/drain structures may have the same width in the x direction and the same height in a vertical direction (z).

Figure 4:
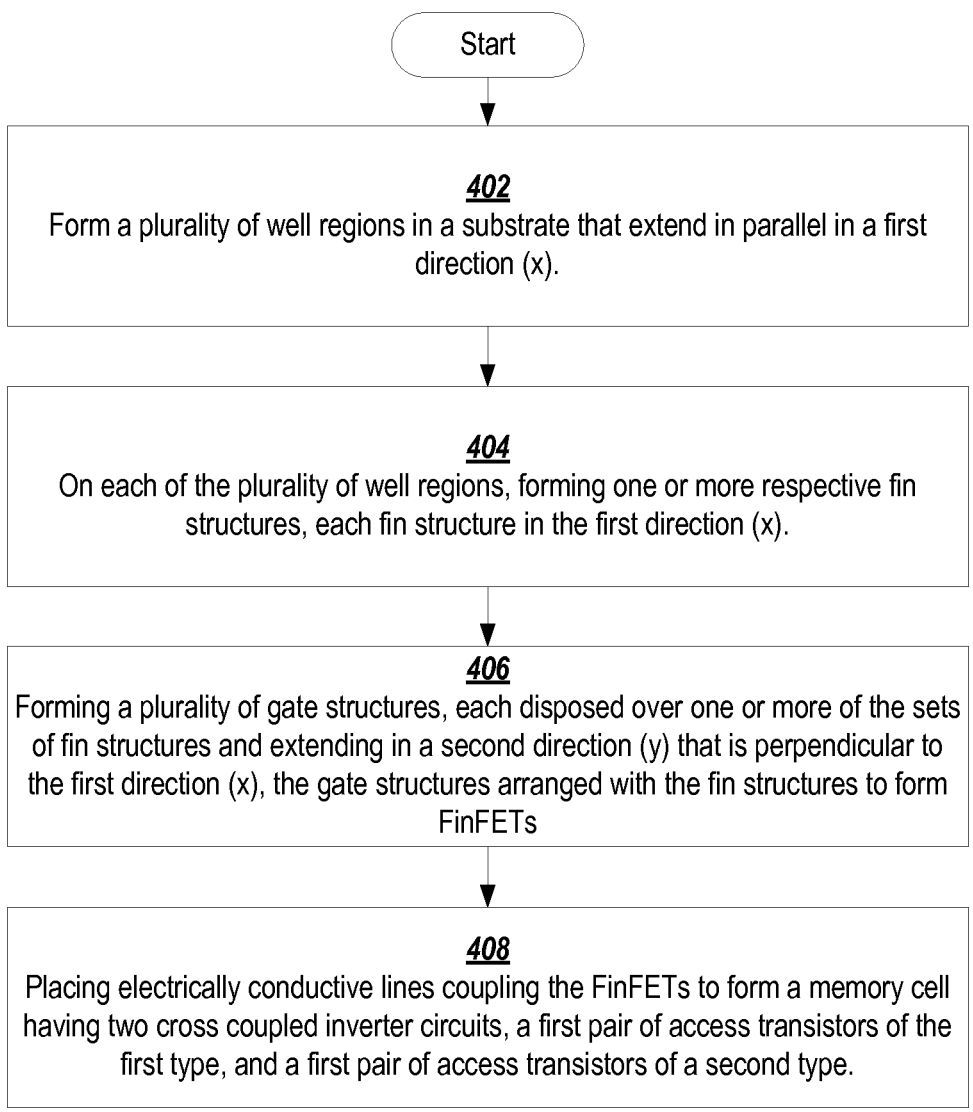
FIG. 4 shows a method for manufacture of a dual-port memory cell using a FinFET manufacturing process.

FIG. 4 shows a method for manufacture of a dual-port memory cell using a FinFET manufacturing process. At block 402, a plurality of well regions is formed in a substrate. The well regions extend in parallel in a first direction (y). At block 404, one or more respective fin structures are formed on each of the plurality of well regions. The number of transistors and their area are equally distributed in the plurality of well regions. Each fin structure extends in the first direction (y). At block 406, a plurality of gate structures are formed over one or more of the sets of fin structures, and the gate structures extend in a second direction (x) that is perpendicular to the first direction (y). The gate structures are arranged with the fin structures to form FinFETs. At block 408, electrically conductive lines are placed to couple the FinFETs to form a memory cell having two cross coupled inverter circuits, a first pair of access transistors of the first type, and a first pair of access transistors of a second type.

The examples included hereinabove describe the SRAM cells in terms of two inverters formed from a PMOS pull-up transistor and an NMOS pull-down transistor. It is also recognized that SRAM cells can be implemented using inverter circuits of various configurations. One skilled in the art will recognize that other dual port SRAM configurations may be implemented with both p-type and n-type FinFET access transistors.

The method described in this patent could be used to add a 3rd or 4th port to a memory cell. The decision on adding the Nth port as a PMOS port or an NMOS port would be determined by the design goals described in FIG. 5. For some designs, use of PMOS transistors for additional access transistors may provide better SEU Tolerance. For example, for a multi-port memory cell having a number (N) of pairs of access transistors (where N>2), the memory cell includes 2 NMOS access transistors and 2*(N−1) PMOS access transistors. Some other designs include a balanced number of PMOS and NMOS access transistors to reduce layout space of the memory cell. For example, for a multi-port memory cell having an even number (N) of pairs of access transistors, the memory cell includes N/2 pairs of PMOS access transistors and N/2 pairs of NMOS access transistors.

Figure 5:
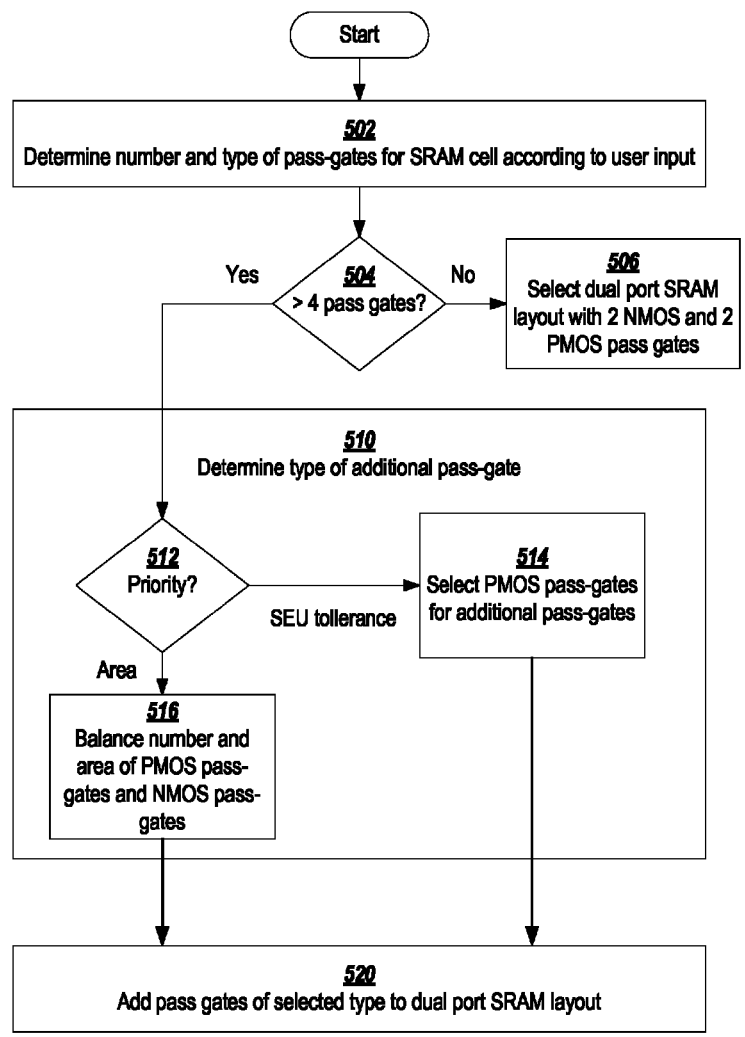
FIG. 5 shows a process for determining the type of access transistors to be used in implementation of a multi-port SRAM cell.

FIG. 5 shows a process for determining the type of access transistors to be used in implementation of a multi-port SRAM cell. At block 502, the number of access transistors are determined for an SRAM cell according to user input. If the number of access transistors are to be implemented, as viewed at decision block 504, a dual port SRAM cell layout (e.g., FIG. 2-1) is used at block 506. Otherwise, if the number of access transistors to be included in the SRAM cell is greater than 4, the type of the additional access transistors (i.e., >4) are determined at block 510. If user input at decision block 512 indicates priority is to optimize for area, the number and area of PMOS and NMOS access transistors are selected to be balanced at block 516. Otherwise, if user input at decision block 512 indicates priority is to optimize for SEU tolerance, the PMOS type access transistors are selected for the additional access transistors (i.e., >4) at block 514. At block 520, the selected type(s) of access transistors are added to the dual-port SRAM cell layout (e.g., shown in FIG. 2-1).

The disclosure is thought to be applicable to a variety of SRAM cell applications. Other aspects and features will be apparent to those skilled in the art from consideration of the specification. For instance, although implementations may in some cases be described in individual figures, it will be appreciated that features from one figure can be combined with features of another figure even though the combination is not explicitly shown or explicitly described as a combination. It is intended that the specification and illustrated structures and methods be considered as examples only, with a true scope of the invention being indicated by the following claims.

What is claimed is:

1. A multi-port memory cell, comprising:
   first and second inverter circuits, each inverter circuit including a pull-up transistor of a first type and a pull-down transistor of a second type;
   wherein in each inverter circuit:
      a gate of the pull-up transistor and a gate of the pull-down transistor are each coupled to a first node and receive the same voltage potential,
      a source of the pull-up transistor and a drain of the pull-down transistor are coupled in series and provide an inverted output at a second node between the pull-up and pull-down transistors, and
      the first node of each inverter circuit is coupled to the second node of the other inverter circuit to receive the inverted output of the other inverter circuit;
   a first pair of access transistors of the first type, each coupled to the first node of a respective one of the first and second inverter circuits;
   a second pair of access transistors of the second type, each coupled to the first node of a respective one of the first and second inverter circuits;
   a substrate;
   a plurality of well regions in the substrate and extending in parallel in a first direction (y);
   each of the plurality of well regions having a respective set of fin structures disposed on the region, each fin structure in the respective set extending in the first direction (y); and
   a plurality of gate structures, each gate structure disposed over one or more of the sets of fin structures and extending in a second direction (x) that is perpendicular to the first direction (y), the fin structures and gate structures configured and arranged to form the FinFETs.

2. The multi-port memory cell of claim 1, wherein the transistors of the first type have gate dimensions that are equal to gate dimensions of the transistors of the second type.

3. The multi-port memory cell of claim 1, wherein each of the first pair of access transistors includes a number of fins equal to a number of fins included in each of the second pair of access transistors.

4. The multi-port memory cell of claim 1, wherein each of the FinFETs of the multi-port memory cell shares a source/drain with a source/drain of another one of the FinFETs of the same type.

5. The multi-port memory cell of claim 1, wherein the plurality of well regions includes no more than three well regions.

6. The multi-port memory cell of claim 1, wherein the first type is a PMOS, and the second type is an NMOS.

7. The multi-port memory cell of claim 1, wherein:
the multi-port memory cell includes an even number (N) of pairs of access transistors, where N>2; and
a total number of access transistors in the multi-port memory cell includes a first number (X) of p-type transistors, and a second number (Y) of n-type transistors, where X=Y.

8. The multi-port memory cell of claim 1, wherein:
the multi-port memory cell includes a number (N) of pairs of access transistors, where N>2; and
a total number of access transistors in the multi-port memory cell includes 2*(N−1) transistors of the first type and two transistors of the second type.

9. The multi-port memory cell of claim 8, wherein the access transistors of the first type are less susceptible to single event upset in comparison to the access transistors of the second type.

10. A method of constructing a dual-port memory cell, comprising:
forming a plurality of well regions in a substrate and extending in parallel in a first direction (y);
on each of the plurality of well regions, forming a respective set of one or more fin structures, each fin structure extending in the first direction (y);
forming a plurality of gate structures, each gate structure disposed over one or more of the sets of fin structures and extending in a second direction (x) that is perpendicular to the first direction (y), the sets of fin structures and gate structures configured and arranged to form FinFETs; and
placing electrically conductive lines to couple the FinFETs to form a memory cell having:
first and second inverter circuits, each inverter circuit including a pull-up transistor of a first type and a pull-down transistor of a second type;
wherein in each inverter circuit, a gate of the pull-up transistor, and a gate of the pull-down transistor are each coupled to a first node and receive the same voltage potential;
wherein a source of the pull-up transistor and a drain of the pull-down transistor are coupled in series and provide an inverted output at a second node between the pull-up and pull-down transistors;
wherein the first node of each inverter circuit is coupled to the second node of the other inverter circuit to receive the inverted output of the other inverter circuit;
a first pair of access transistors of the first type, each coupled to the first node of a respective one of the first and second inverter circuits; and
a second pair of access transistors of the second type, each coupled to the first node of a respective one of the first and second inverter circuits.

11. The method of claim 10, wherein:
the forming of the plurality of well regions includes forming each of the plurality of well regions with the same width in the second direction X; and
the forming of the sets of one or more fin structures includes forming each of the sets of the one or more fin structures with the same dimensions in the second direction X and in a third direction perpendicular to the first and second directions.

12. The method of claim 10, wherein the forming of the respective sets of one or more fin structures includes forming a same number of the fin structures in each of the plurality of well regions.

13. The method of claim 12, wherein the forming of the plurality of well regions, the respective sets of fin structures, and the plurality of gate structures produces each of the FinFETs with the same number of fins.

14. The method of claim 12, wherein the forming of the plurality of well regions, the respective sets of fin structures, and the plurality of gate structures produces each of the FinFETs with a source/drain region shared with another one of the FinFETs of the same type.

15. The method of claim 10, wherein the first type is a P-MOSFET, and the second type is an N-MOSFET.

16. The method of claim 10, wherein the access transistors of the first type are less susceptible to single event upset in comparison to the access transistors of the second type.

17. The method of claim 10, wherein:
the placing of electrically conductive lines to couple the FinFETs to form a memory cell forms a multi-port memory cell having an even number (N) of pairs of access transistors, where N>2; and
a total number of access transistors in the multi-port memory cell includes a first number (X) of p-type transistors and a second number (Y) of n-type transistors, where X=Y.

18. The method of claim 10, wherein:
the placing of electrically conductive lines to couple the FinFETs to form a memory cell forms a multi-port memory cell having a number (N) of pairs of access transistors, where N>2; and
a total number of access transistors in the multi-port memory cell includes two n-type transistors and 2*(N−1) p-type transistors.

19. A multi-port memory cell, comprising:
first and second inverter circuits, each inverter circuit including a pull-up transistor of a first type and a pull-down transistor of a second type;
wherein in each inverter circuit:
a gate of the pull-up transistor and a gate of the pull-down transistor are each coupled to a first node and receive the same voltage potential;
a source of the pull-up transistor and a drain of the pull-down transistor are coupled in series and provide an inverted output at a second node between the pull-up and pull-down transistors; and
the first node of each inverter circuit is coupled to the second node of the other inverter circuit to receive the inverted output of the other inverter circuit;
a first pair of access transistors of the first type, each coupled to the first node of a respective one of the first and second inverter circuits; and
a second pair of access transistors of the second type, each coupled to the first node of a respective one of the first and second inverter circuits;
wherein:
the multi-port memory cell includes an even number (N) of pairs of access transistors, where N>2; and a total number of access transistors in the multi-port memory cell includes a first number (X) of p-type transistors, and a second number (Y) of n-type transistors, where X=Y.

20. The multi-port memory cell of claim 19, wherein the access transistors of the first type are less susceptible to single event upset in comparison to the access transistors of the second type.

\* \* \* \* \*